(12) United States Patent
Han

(10) Patent No.: US 12,386,109 B2
(45) Date of Patent: Aug. 12, 2025

(54) DISPLAY PANEL, DISPLAY MOTHERBOARD, AND DISPLAY DEVICE

(71) Applicant: Shenzhen China Star Optoelectronics Semiconductor Display Technology Co., Ltd., Guangdong (CN)

(72) Inventor: Zhibin Han, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 922 days.

(21) Appl. No.: 17/263,668

(22) PCT Filed: Dec. 31, 2020

(86) PCT No.: PCT/CN2020/142246
§ 371 (c)(1),
(2) Date: Jan. 27, 2021

(87) PCT Pub. No.: WO2022/141436
PCT Pub. Date: Jul. 7, 2022

(65) Prior Publication Data
US 2022/0397709 A1   Dec. 15, 2022

(30) Foreign Application Priority Data

Dec. 30, 2020 (CN) .......................... 202011603253.X

(51) Int. Cl.
*G02B 5/20* (2006.01)
*H10K 59/122* (2023.01)

(52) U.S. Cl.
CPC ........... *G02B 5/201* (2013.01); *H10K 59/122* (2023.02)

(58) Field of Classification Search
CPC .............................. G02B 5/201; H10K 59/122
See application file for complete search history.

(56) References Cited

U.S. PATENT DOCUMENTS

| | | | |
|---|---|---|---|
| 2008/0024402 A1* | 1/2008 | Nishikawa | H10K 50/813 345/82 |
| 2014/0197396 A1* | 7/2014 | Madigan | H10K 50/818 438/34 |
| 2015/0090988 A1* | 4/2015 | Oooka | H10K 59/1216 257/40 |
| 2016/0005798 A1* | 1/2016 | Akiyama | H10K 59/35 257/72 |
| 2016/0013251 A1 | 1/2016 | Yoshida | |

(Continued)

FOREIGN PATENT DOCUMENTS

| | | |
|---|---|---|
| CN | 1734746 | 2/2006 |
| CN | 105336881 | 2/2016 |

(Continued)

*Primary Examiner* — Dzung Tran

(57) ABSTRACT

A display panel, a display motherboard and a display device are provided. The display panel has a plurality of banks and a first sub-pixel group located between two adjacent banks. The first sub-pixel group has a first sub-pixel and a second sub-pixel adjacent to each other, so as to reduce number of banks in the display panel by having no banks between the first sub-pixel and the second sub-pixel, thereby improving a pixel area ratio. This display panel can take into account both requirements of an aperture ratio and a printing process, which is beneficial to mass production.

10 Claims, 7 Drawing Sheets

(56) References Cited

U.S. PATENT DOCUMENTS

2017/0236883 A1\* 8/2017 Madigan ................ H10K 50/15
  257/40
2018/0166510 A1\* 6/2018 Lee ........................ H10K 59/35
2018/0294324 A1\* 10/2018 Madigan .............. H10K 59/353

FOREIGN PATENT DOCUMENTS

| CN | 108231827 | 6/2018 |
| CN | 111200004 | 5/2020 |
| CN | 111524937 | 8/2020 |
| CN | 112599585 | 4/2021 |
| JP | 2017-142946 | 8/2017 |

\* cited by examiner

DISPLAY PANEL, DISPLAY MOTHERBOARD, AND DISPLAY DEVICE

RELATED APPLICATIONS

This application is a National Phase of PCT Patent Application No. PCT/CN2020/142246 having International filing date of Dec. 31, 2020, which claims the benefit of priority of Chinese Patent Application No. 202011603253.X filed on Dec. 30, 2020. The contents of the above applications are all incorporated by reference as if fully set forth herein in their entirety.

FIELD AND BACKGROUND OF THE INVENTION

The present disclosure relates to displays, and more particularly to a display panel, a display motherboard, and a display device.

Each pixel in an existing display panel includes three banks on average, and a large number of banks reduces an area ratio of pixels. In order to improve an aperture ratio of blue sub-pixels, an area ratio of red and green sub-pixels will be further compressed, so that a size of the red and green sub-pixels will seriously fail to meet a minimum width requirement of a line-bank printing, which is not beneficial to mass production.

SUMMARY OF THE INVENTION

An embodiment of the present application provides a display panel, a display mother board, and a display device, which can meet requirements of a pixel aperture ratio and a printing process.

An embodiment of the present application provides a display panel including: a plurality of banks, wherein each of the plurality of banks extends in a first direction, and the plurality of banks are arranged in a second direction; and a first sub-pixel group located between two adjacent banks, wherein the first sub-pixel group comprises a first sub-pixel and a second sub-pixel adjacent to each other.

An embodiment of the present application further provides a display motherboard including: a plurality of banks, wherein each of the plurality of banks extends in a first direction, and the plurality of banks are arranged in a second direction; and a plurality of display panels comprising a first display panel and a second display panel with different sizes, wherein a long side of the first display panel is parallel to the plurality of banks, and a short side of the second display panel is parallel to the plurality of banks, wherein the first display panel comprises a first sub-pixel group located between two adjacent banks, and the first sub-pixel group comprises a first sub-pixel and a second sub-pixel adjacent to each other.

An embodiment of the present application further provides a display device including any one of the above display panels.

Compared with conventional technologies, an embodiment of the present application provides a display panel, a display mother board, and a display device. The display panel includes: a plurality of banks, wherein each of the plurality of banks extends in a first direction, and the plurality of banks are arranged in a second direction; and a first sub-pixel group is located between two adjacent banks, wherein the first sub-pixel group comprises a first sub-pixel and a second sub-pixel adjacent to each other, so as to reduce number of banks in the display panel by having no banks between the first sub-pixel and the second sub-pixel, thereby improving a pixel area ratio. This display panel can take into account both requirements of an aperture ratio and a printing process, which is beneficial to mass production.

DESCRIPTION OF SPECIFIC EMBODIMENTS OF THE INVENTION

In order to make purposes, technical solutions and effects of the present application are clearer and more unambiguous, the following further describes the application in detail with reference to drawings and embodiments. It should be understood that specific embodiments described here are only used to explain the application, and not used to limit the application.

Figure 1A:
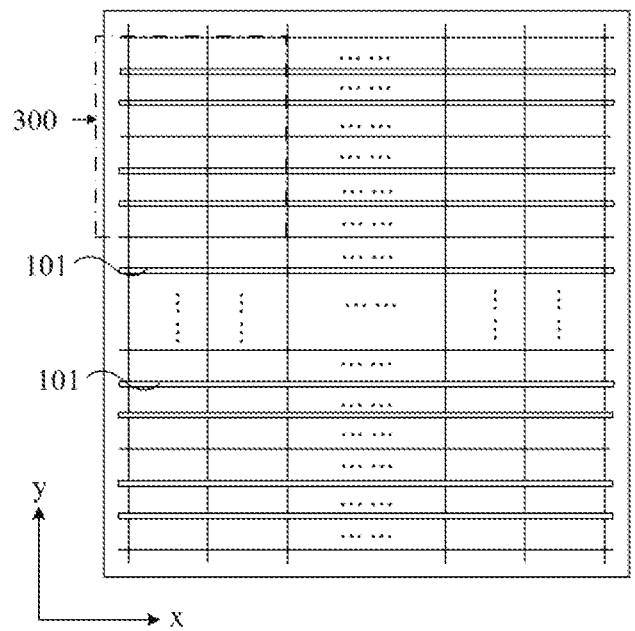
FIG. 1A to FIG. 1B are schematic structural diagrams of a display panel according to an embodiment of the present application.
Figure 1B:
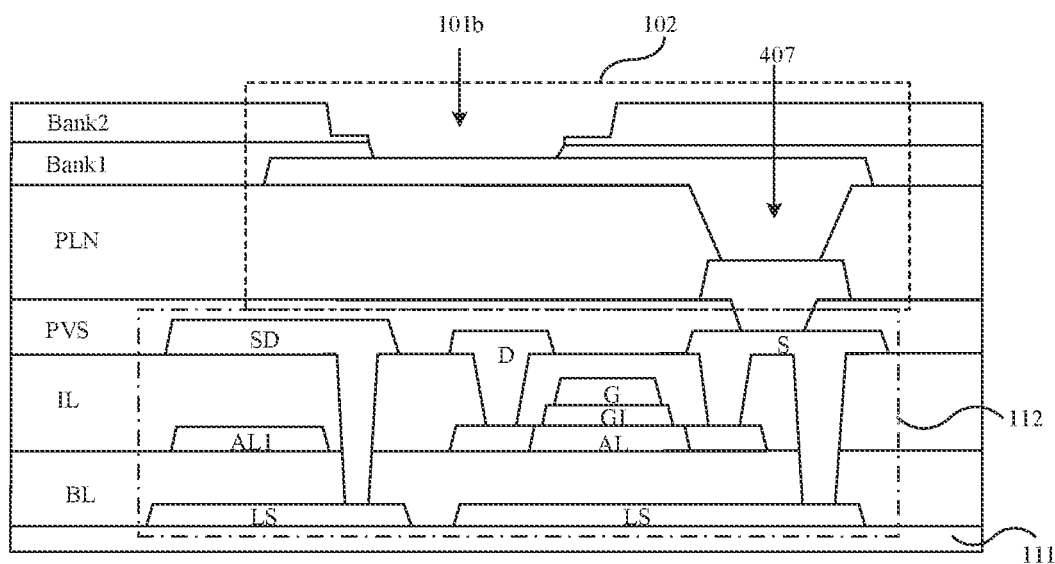

Specifically, referring to FIG. 1A to FIG. 1B, which are schematic structural diagrams of a display panel according to an embodiment of the present application. FIG. 2A to FIG. 2I are schematic structural diagrams of pixel repeating units according to embodiments of the present application.

An embodiment of the present application provides a display panel including: a plurality of banks 101, wherein each of the plurality of banks 101 extends in a first direction x, and the plurality of banks 101 are arranged in a second direction y; and a first sub-pixel group 201 located between two adjacent banks 101, wherein the first sub-pixel group 201 comprises a first sub-pixel 2011 and a second sub-pixel 2012 adjacent to each other. That is, no banks 101 between the first sub-pixel 2011 and the second sub-pixel 202, so as to reduce number of banks 101 in the display panel, thereby improving a pixel area ratio of the display panel. This display panel can take into account both requirements of an aperture ratio and a printing process, which is beneficial to mass production.

The display panel includes a plurality of pixel repeating units 300, wherein each of the pixels includes a first color pixel, a second color pixel, and a third color pixel. Optionally, light-emitting colors of the first color pixel, the second color pixel, and the third color pixel are different. The first color pixel, the second color pixel, and the third color pixel have light-emitting colors including red, green, blue, yellow, or white.

At least one of the pixels includes the first sub-pixel 2011 and/or the second sub-pixel 2012. That is, the first sub-pixel 2011 and the second sub-pixel 2012 may be located in different pixels, as shown in FIG. 2A to FIG. 2F. The first sub-pixel 2011 and the second sub-pixel 2012 may also be located in a same pixel, as shown in FIG. 2G to FIG. 2I.

Please continue to refer to FIG. 2A to FIG. 2F, taking the first sub-pixel 2011 and the second sub-pixel 2012 in different pixels as an example for description. The first sub-pixel 2011 and the second sub-pixel 2012 are adjacent to each other along the second direction y. The display panel includes a plurality of pixel repeating units 300. Each pixel repeating unit 300 includes a first pixel 301 and a second pixel 302 arranged along a second direction y, the first pixel 301 includes the first sub-pixel 2011, and the second pixel 302 includes the second sub-pixel 2012. Specifically, the first color pixel 3011 of the first pixel 301 is formed by the first sub-pixel 2011, and the first color pixel 3021 of the second pixel 302 is formed by the second sub-pixel 2012, such that there are no banks 101 between the first sub-pixel 2011 and the second sub-pixel 202. Therefore, number of banks 101 is reduced, thereby improving an area ratio of the first pixel 301 and the second pixel 302.

Optionally, light-emitting colors of the first sub-pixel 2011 and the second sub-pixel 2012 are the same. The light-emitting colors of the first sub-pixel 2011 and the second sub-pixel 2012 include one of blue, red, green, yellow, or white.

Further, the first pixel 301 and the second pixel 302 both include a second color pixel and a third color pixel. Optionally, light-emitting colors of the first color pixel, the second color pixel, and the third color pixel include red, green, blue, yellow, white, and the like.

Further, the light-emitting colors of the first color pixel, the second color pixel, and the third color pixel are red, green, and blue in order. In order to make the third color pixel that emits blue light have a larger aperture ratio while ensuring aperture ratios of the first color pixel emitting red light and the second color pixel emitting green light, aperture ratios of the first color pixel, the second color pixel, and the third color pixel can be determined according to a light-emitting lifetime and a light-emitting intensity of the first color pixel, the second color pixel, and the third color pixel, respectively. That is, by setting widths of the first color pixel, the second color pixel, and the third color pixel, the aperture ratio of the third color pixel emitting blue light is greater than the aperture ratios the first color pixel emitting red light and the second color pixel emitting green light. Specifically, assuming that an initial value of a white balance of the display panel is set to Wb, a ratio relationship of red light, green light, and blue light is r1:g1:b1. Lifetimes of light emitting devices emitting red, green, and blue light (T95: brightness attenuation is 95% of the original) are Lr hours, Lg hours and Lb hours, respectively. Widths of the first color pixel, the second color pixel, and the third color pixel are W1=r1/Lr; W2=g1/Lg; W3=b1/Lb, wherein: W1 is a width of the first color pixel emitting red light, W2 is a width of the second color pixel emitting green light, and W3 is a width of the third color pixel emitting blue light.

Assuming that the initial white balance value of the display panel Wb=9600K (the corresponding color coordinate value is (0.29, 0.31)), a ratio relationship between red light, green light and blue light is r1:g1:b1=35:105:12. The lifetimes of light emitting devices emitting red, green, and blue light (T95:brightness attenuation is 95% of the original) are Lr=600 hours, Lg=1500 hours and Lb=44 hours, respectively. The widths of the first color pixel, the second color pixel, and the third color pixel are W1=35/600; W2=103/1500; W3=12/44.

Figure 2A:
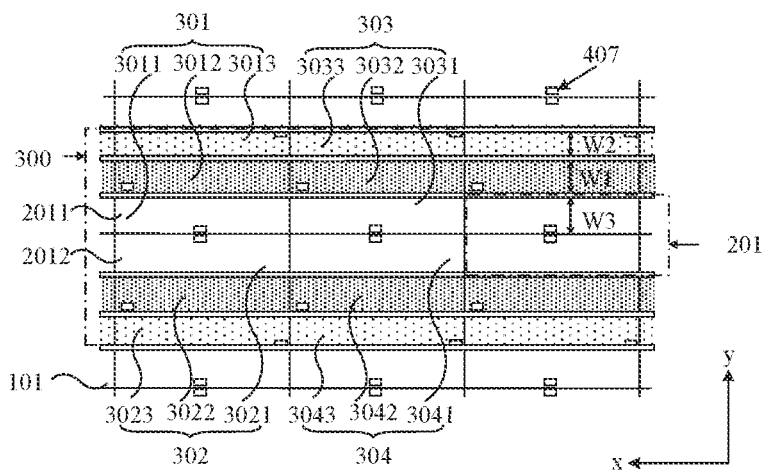
FIGS. 2A, 2B, 2O, 2D, 2E, 2F, 2G, 2H and FIG. 2I are schematic structural diagrams of pixel repeating units according to embodiments of the present application.
Figure 2B:
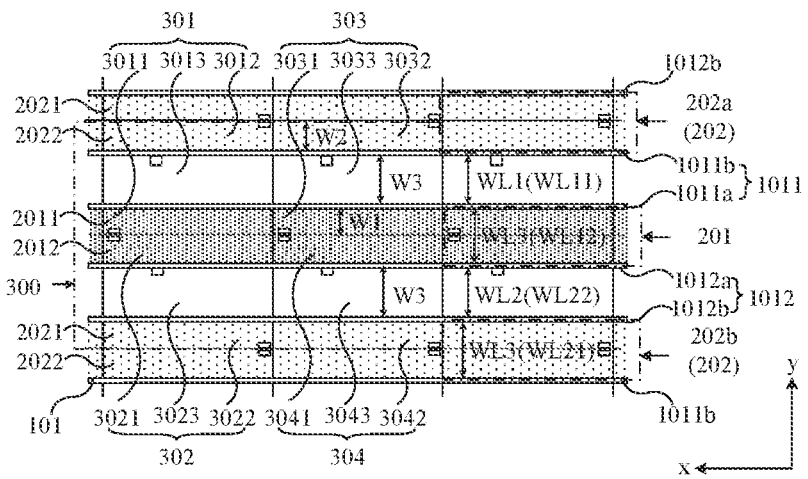

The second color pixel and the third color pixel may be respectively located between the two banks 101, as shown in FIG. 2A. The second color pixel or the third color pixel may also be formed in a form of a sub-pixel group, as shown in FIG. 2B. The second color pixels of the first pixel 301 and the second pixel 302 together with the first color pixels of the first pixel 301 and the second pixel 302 may also be located in the first sub-pixel group 201. The third color pixel is located on a side of the bank 101 away from the first color pixel and the second color pixel, as shown in FIG. 2C to FIG. 2F.

Please continuing to refer to FIG. 2A, the second color pixel 3012, the third color pixel 3013 of the first pixel 301, and the second color pixel 3022 and the third color pixel 3023 of the second pixel 302 are respectively located between two banks 101. The second color pixel 3012 and the third color pixel 3013 of the first pixel 301 are located at a side of the first color pixel 3011 of the first pixel 301 away from the first color pixel 3021 of the second pixel 302. The second color pixel 3022 and the third color pixel 3023 of the second pixel 302 are located at a side of the first color pixel 3021 of the second pixel 3024 away from the first color pixel 3011 of the first pixel 301. Optionally, the light-emitting colors of the first color pixel, the second color pixel, and the third color pixel are blue, green, and red in order.

Please continuing to refer to FIG. 2B, the second color pixel or the third color pixel is formed in a form of a sub-pixel group. That is, the display panel further includes a second sub-pixel group 202 spaced apart from the first sub-pixel group 201, and the second sub-pixel group 202 is located between two adjacent banks 101. The two sub-pixel group 202 includes a third sub-pixel 2021 and a fourth sub-pixel 2022 adjacent to each other along the second direction y. The first pixel 301 includes the fourth sub-pixel 2022 of the second sub-pixel group 202, and the second pixel 302 includes the third sub-pixel 2021 of another second sub-pixel group 202. It is understood that the third sub-pixel 2021 and the fourth sub-pixel 2022 may also be adjacent along the first direction x.

Specifically, the bank 101 includes a first bank 1011 and a second bank 1012 periodically arranged along the second direction y, and the first bank 1011 and the second bank 1012 extends respectively along the direction x. The first bank 1011 includes a first main bank 1011a and a first slave bank 1011b, and the second bank 1012 includes a second main bank 1012a and a second slave bank 1012b. The first sub-pixel group 201 is located between the first main bank 1011a and the second main bank 1012a. The second sub-pixel group 202 is located between the first slave bank 1011b and the second slave bank 1012b.

The first color pixel 3011 of the first pixel 301 is formed by the first sub-pixel 2011. The second color pixel 3012 of the first pixel 301 is formed by the fourth sub pixel 2022 of the second sub pixel group 202a. The third color pixel 3013 of the first pixel 301 is located between the first main bank 1011a and the first slave bank 1011b. The first color pixel 3021 of the second pixel 302 is formed by the second sub-pixel 2012. The second color pixel 3022 of the second pixel 302 is formed by the third sub-pixel 2021 of the second sub-pixel group 202b. The third color pixel 3023 of the second pixel 302 is located between the second main bank 1012a and the second slave bank 1012b. Therefore, both the first pixel 301 and the second pixel 302 include two banks 101. Compared with the prior art of a design of a pixel including three banks on average, the present disclosure can reduce number of banks and improve the area ratio of pixels, so that the display panel can take into account both the aperture ratio requirement and the printing process requirement, which is beneficial to realize mass production.

Optionally, the light-emitting colors of the third sub-pixel 2021 and the fourth sub-pixel 2022 are the same. The first sub-pixel 2011, the second sub-pixel 2012, the third sub-pixel 2021, and the fourth sub-pixel 2022 have different light-emitting colors. Further, the light-emitting colors of the third sub-pixel 2021 and the fourth sub-pixel 2022 include one of blue, red, or green. Furthermore, the light-emitting color of the first sub-pixel 2011 and the second sub-pixel 2012 is one of red and green, and the third sub-pixel 2021 and the light-emitting color of the third sub-pixel 2021 and the fourth sub-pixel 2022 of the second sub-pixel group 202 is the other of red and green.

Further, if the light-emitting color of the third color pixel 3013 is blue; the emission color of the first color pixel 3011 is one of red or green, and the emission color of the second color pixel 3012 is the other red or green. A distance WL1 between two adjacent first banks 1011 is equal to the width W3 of a third color pixel 3013, and/or a distance WL2 between two adjacent second banks 1012 is equal to the width W3 of a third color pixel 3013. The distance WL1 between two adjacent first banks 1011 and/or the distance WL2 between two adjacent second banks 1012 may be less than or equal to a distance WL3 between the first bank 1011 and the second bank 1012 (that is, a width of the first sub-pixel group 201 or width of the second sub-pixel group 202). Therefore, the aperture ratio of the third color pixel emitting blue light is greater than the aperture ratio of the first color pixel 3011 emitting red light and the second color pixel 3012 emitting green light, thereby improving a problem of poor light-emitting efficiency of the third color emitting blue light.

Further, the light-emitting color of the first sub-pixel 2011 and the second sub-pixel 2012 is red. The light-emitting color of the third sub-pixel 2021 and the fourth sub-pixel 2022 is green. The distance between the first main bank 1011a and the second main bank 1012a is less than or equal to the distance between the first slave bank 1011b and the second slave bank 1012b. Therefore, the aperture ratio of the second color pixel emitting green light is greater than or equal to the aperture ratio of the first color pixel emitting red light.

For example, widths of the first color pixel, the second color pixel, and the third color pixel that emit red, green, and blue light are W1=35/600; W2=103/1500; W3=12/44. The distance between the first main bank 1011a and the first slave bank 1011b is WL11. The distance between the second main bank 1012a and the second slave bank 1012b is WL22. The distance between the first main bank 1011a and the second main bank 1012a is WL12. The distance between the first slave bank 1011b and the second slave bank 1012b is WL21. The widths of WL11, WL22, WL12 and WL21 are WL11=12/44=WL22; WL12=2*35/600; WL21=2*103/1500, respectively.

To simplify a calculation process, when the light-emitting color of the first sub-pixel group 201 is red and the light-emitting color of the second sub-pixel 202 is green, the width ratio of the first sub-pixel group 201 (i.e., width WL12), and the second sub-pixel group 201 (i.e., width WL21) to the distance WL11 or WL22 can be set to 1:1:1-2:2:1.

Please refer to FIG. 2C to FIG. 2F. The second color pixel of the first pixel 301 and the second pixel 302 together with the first color pixel of the first pixel 301 and the second pixel 302 are both located in the first sub-pixel group 201. The third color pixel is located on a side of the bank 101 away from the first color pixel and the second color pixel. That is, the first sub-pixel group 201 further includes a fifth sub-pixel 2013 and a sixth sub-pixel 2014 that are adjacent along the second direction y. The fifth sub-pixel 2013 is arranged on a side of the first sub-pixel 2011 along the first direction x. The sixth sub-pixel 2014 is arranged on a side of the second sub-pixel 2012 along the first direction x. The first pixel 301 includes the fifth sub-pixel 2013, and the second pixel 302 includes the sixth sub-pixel 2014.

Figure 2C:
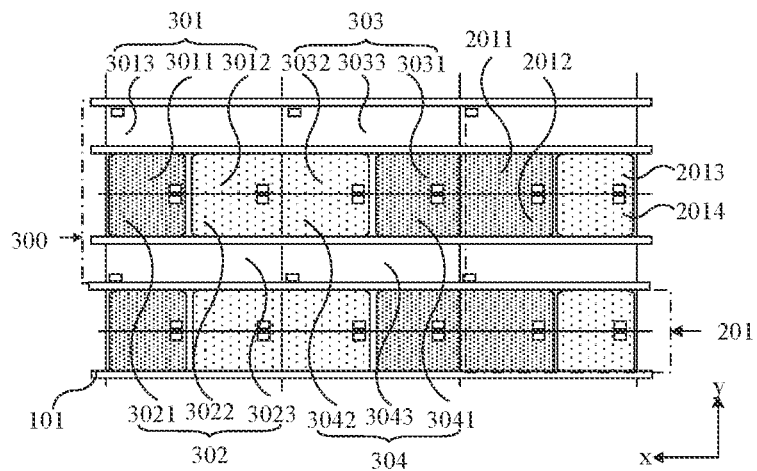
Figure 2D:
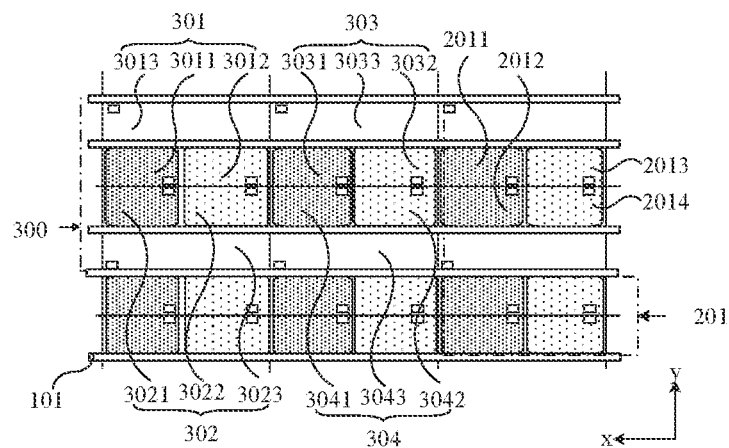

Specifically, please continuing to refer to FIG. 2C~FIG. 2D, the second color pixel 3012 of the first pixel 301 is formed by the fifth sub-pixel 2013. The second color pixel 3022 of the second pixel 302 is formed by the sixth sub-pixel 2014. The third color pixel 3013 of the first pixel 301 and the third color pixel 3023 of the second pixel 302 are respectively located on both sides of the first sub-pixel group 201. Therefore, the first pixel 301 and the second pixel 302 each include 1.5 banks 101, and number of banks 101 is further reduced.

Figure 2E:
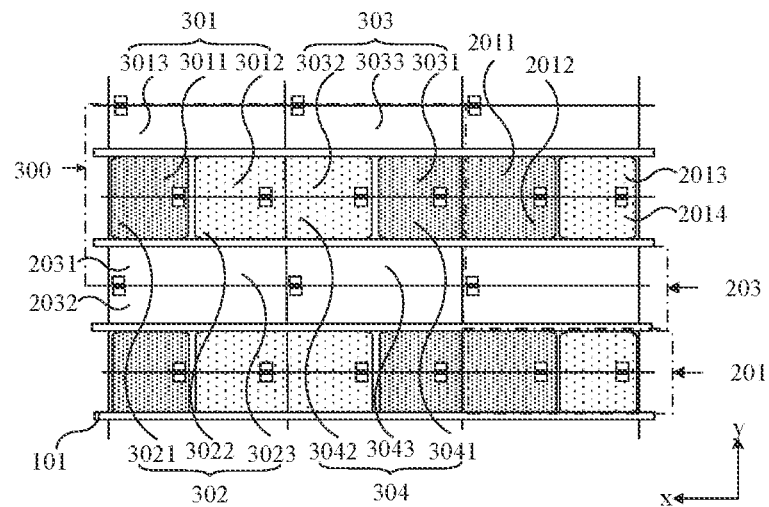
Figure 2F:
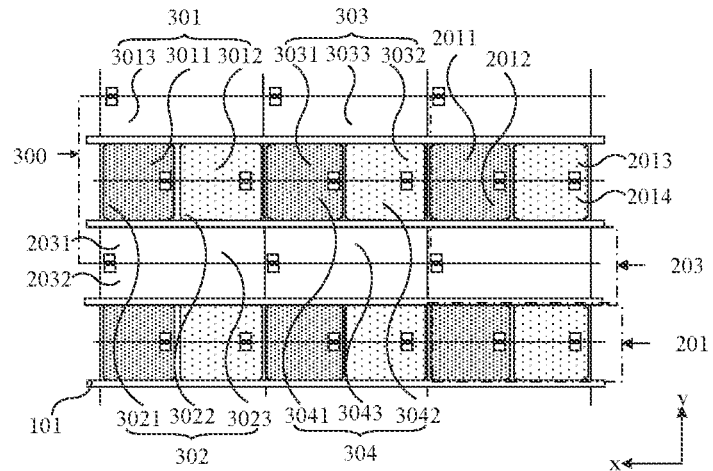
Figure 2G:
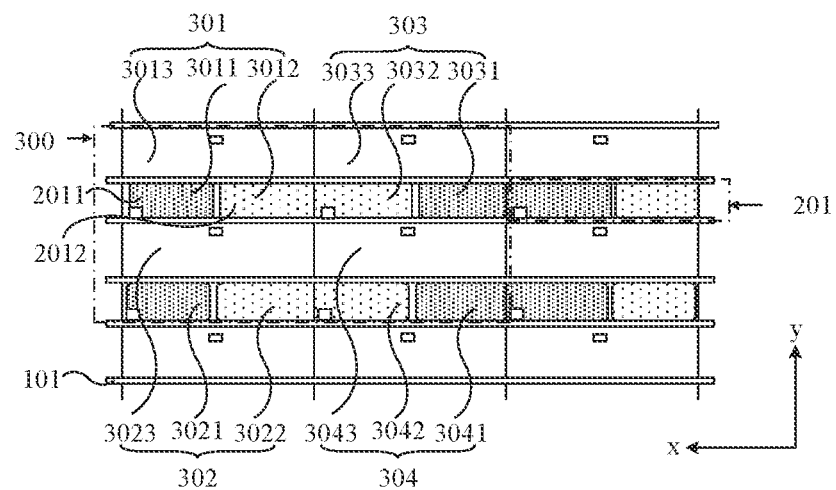
Figure 2H:
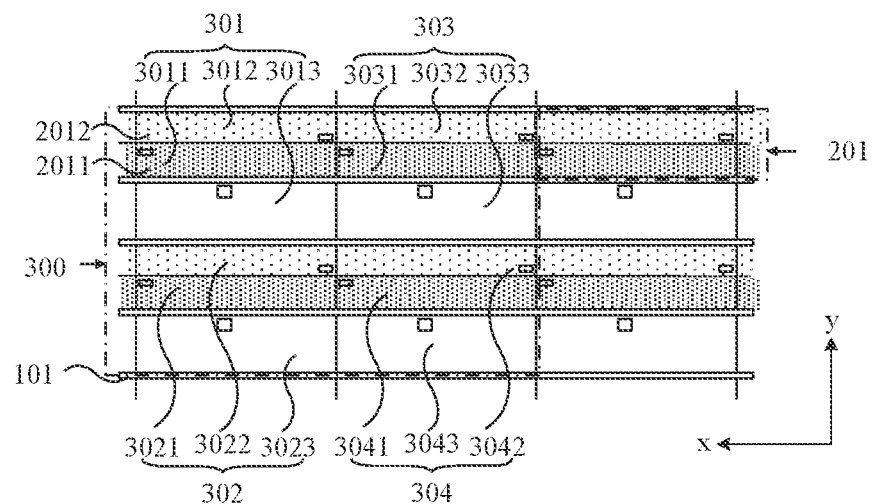
Figure 2I:
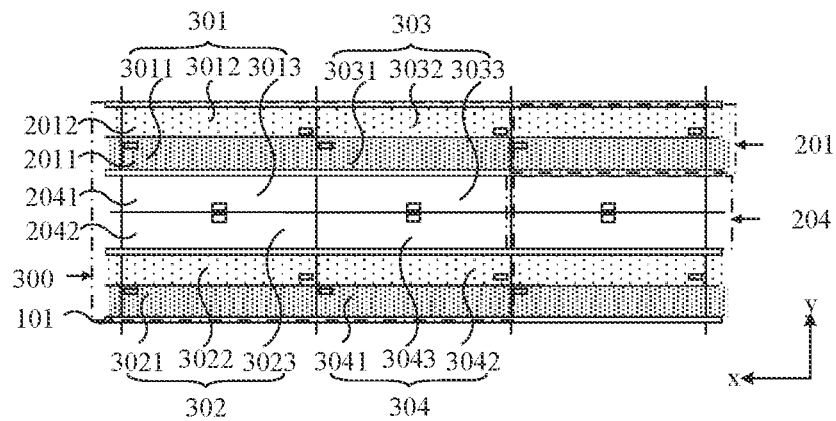

Further, please continuing to refer to FIG. 2E~FIG. 2F, the display panel further includes a third sub-pixel group 203. The third sub-pixel group 203 includes a seventh sub-pixel 2031 and an eighth sub-pixel 2032, and the seventh sub-pixel 2031 and the eighth sub-pixel 2032 are adjacent to each other. The third sub-pixel group 203 and the first sub-pixel group 201 share a same bank 101.

Further, the third sub-pixel group 203 is located between two first sub-pixel groups 201, and the bank 101 is located between the first sub-pixel group 201 and the third sub-pixel group 203, please referring to FIG. 2E~FIG. 2F. Or, the third sub-pixel group 203 is located between the first sub-pixel group 201 and the second sub-pixel group 202, and the bank 101 is located among the first sub-pixel group 201, the second sub-pixel group 202, and the third sub-pixel group 203.

Please continuing to refer to FIG. 2E~FIG. 2F, the first color pixel 3011 of the first pixel 301 is formed by the first sub-pixel 2011, the second color pixel 3012 of the first pixel 301 is formed by the third sub-pixel 2013 of the first sub-pixel group 201, and the third color pixel 3013 of the first pixel 301 is formed by the seventh sub pixel 2031 of the third sub pixel group 203. The first color pixel 3021 of the second pixel 302 is formed by the second sub-pixel 2012 of the first sub-pixel group 201. The second color pixel 3022 of the second pixel 302 is formed by the fourth sub pixel 2014 of the first sub pixel group 201. The third color pixel 3023 of the second pixel 302 is formed by the eighth sub pixel 2032 of the third sub pixel group 203. Therefore, each of the first pixel 301 and the second pixel 302 includes only one bank 101, which reduces number of the banks 101 thereby improving a pixel area ratio. This display panel can take into account both requirements of an aperture ratio and a printing process, which is beneficial to mass production Optionally, the seventh sub-pixel 2031 and the eighth sub-pixel 2032 have a same light-emitting color. Further, the light-emitting color of the seventh sub-pixel 2031 and the eighth sub-pixel 2032 includes one of blue, red, green, or white. Furthermore, the light-emitting color of the first sub-pixel 2011 and the second sub-pixel 2012 is one of red and green, the light-emitting color of the fifth sub-pixel 2013 and the sixth sub-pixel 2014 is the other of red and green, and the light-emitting color of the seventh sub-pixel 2031 and the eighth sub-pixel 2032 is blue.

A width of the first sub-pixel group 201 may be greater than or equal to a width of the third sub-pixel group 203, so that the aperture ratio of the first color pixel emitting blue light is greater than that of the second color pixel emitting red light and the third color pixel emitting green light. The problem of poor light-emitting efficiency of the first color pixels emitting blue light is improved. Further, a ratio of the width of the first sub-pixel group 201 to the width of the third sub-pixel group 203 is 1:1 to 2:1.

Further, please continue to refer to FIG. 2A~FIG. 2F. Each pixel repeating unit 300 further includes a third pixel 303 and a fourth pixel 304 arranged along the second direction y. The third pixel 303 is arranged on a side of the first pixel 301 along the first direction x. The third pixel 303 and the first pixel 301 are arranged symmetrically or repeatedly along an adjacent edge of the first pixel 301 and the third pixel 303. The fourth pixel 304 is arranged on a side of the second pixel 302 along the first direction x. The fourth pixel 304 and the second pixel 302 are arranged symmetrically or repeatedly along an adjacent edge of the second pixel 302 and the fourth pixel 304.

Specifically, the third pixel 303 and the fourth pixel 304 each include a first color pixel, a second color pixel, and a third color pixel. Optionally, a design of the first color pixel 3031, the second color pixel 3032, and the third color pixel 3033 of the third pixel 303 can refer to the design of the first color pixel 3011, the second color pixel 3012 and the third color pixel 3013 of the first pixel 301. A design of the first color pixel 3041, the second color pixel 3042, and the third color pixel 3043 of the fourth pixel 304 can be referred to the design of the first color pixel 3021, the second color pixel 3022 and the third color pixel 3023 of the second pixel 3021. It is not repeated here again.

Referring to FIG. 2G to FIG. 2I, the first sub-pixel 2011 and the second sub-pixel 2012 of the first sub-pixel group 201 may also be located in a same pixel. That is, the display panel further includes a plurality of pixel repeating units 300, each of the pixel repeating units 300 includes a first pixel 301, and the first pixel 301 includes the first sub-pixel 2011 and the second sub-pixel 2012. Optionally, the light-emitting colors of the first sub-pixel 2011 and the second sub-pixel 2012 are different, and the light-emitting colors of the first sub-pixel 2011 and the second sub-pixel 2012 include red, green, blue, yellow, and white.

Specifically, the first pixel 301 includes a first color pixel 3011, a second color pixel 3012, and a third color pixel 3013. The first color pixel 3011 is formed by the first sub-pixel 2011 of the first sub-pixel group 201. The second color pixel 3012 is formed by the second sub-pixel 2012 of the first sub-pixel group 201. The third color pixel 3013 is located on a side of the bank 101 away from the first color pixel 3011 and the second color pixel 3012.

Further, the first sub-pixel 2011 and the second sub-pixel 2012 may be arranged along the first direction x, as shown in FIG. 2G. The first sub-pixel 2011 and the second sub-pixel 2012 can also be arranged along the second direction y, as shown in FIG. 2H. Therefore, that the first pixel 301 includes two banks 101 on average.

Further, as shown in FIG. 2I, the display panel further includes a fourth sub-pixel group 204 located between two first sub-pixel groups 201. The bank 101 is provided between the first sub-pixel group 201 and the fourth sub-pixel group 204. The fourth sub-pixel group 204 includes a ninth sub-pixel 2041 and a tenth sub-pixel 2042 adjacent to each other. The third color pixel 3013 of the first pixel 301 is formed by the ninth sub-pixel 2041, and the third color pixel of the second pixel 302 is formed by the tenth sub-pixel 2042. The ninth sub-pixel 2041 and the tenth sub-pixel 2042 are adjacent along the second direction y, such that the first pixel 301 and the second pixel 302 each include 1.5 banks 101.

Optionally, the light-emitting colors of the first color pixel, the second color pixel, and the third color pixel include red, green, blue, yellow, or white. Further, the light-emitting colors of the first color pixel, the second color pixel, and the third color pixel are red, green, and blue in order. A width of the first sub-pixel group 201 may be less than or equal to a width of the fourth sub-pixel 204, such that an aperture ratio of the third color pixel emitting blue light is greater than those of the first color pixel emitting red light and the second color pixel emitting green light, so as to improve a problem of the poor light-emitting efficiency of the third color pixel emitting blue light.

Further, the second pixel 302 is arranged on one side of the first pixels 301 along the second direction y. The third pixel 303 is arranged on one side of the first pixels 301 along the first direction x. The fourth pixel 304 is arranged on a side of the third pixel 303 along the second direction y. The fourth pixel 304 is arranged on a side of the second pixel 302 along the first direction x. The second pixel 302 and the first pixel 301 are arranged symmetrically or repeatedly along an adjacent edge of the second pixel 302 and the first pixel 301. The third pixel 303 and the first pixel 301 are arranged symmetrically or repeatedly along an adjacent edge of the first pixel 301 and the third pixel 303. The fourth pixel 304 and the second pixel 302 are arranged symmetrically or repeatedly along an adjacent edge of the second pixel 302 and the fourth pixel 304.

Specifically, the second pixel 302, the third pixel 303, and the fourth pixel 304 all include a first color pixel, a second color pixel, and a third color pixel. Optionally, a design of the first color pixel 3021, the second color pixel 3022, and the third color pixel 3023 of the second pixel 302 can refer to the design of the first color pixel 3011, the second color pixel 3012 and the third color pixel 3013 of the first pixel 301. A design of the first color pixel 3041, the second color pixel 3042, and the third color pixel 3043 of the fourth pixel 304 can refer to the design of the first color pixel 3021, the second color pixel 3022 and the third color pixel 3023 of the second pixel 3021. It is not repeated here again.

Figure 3A:
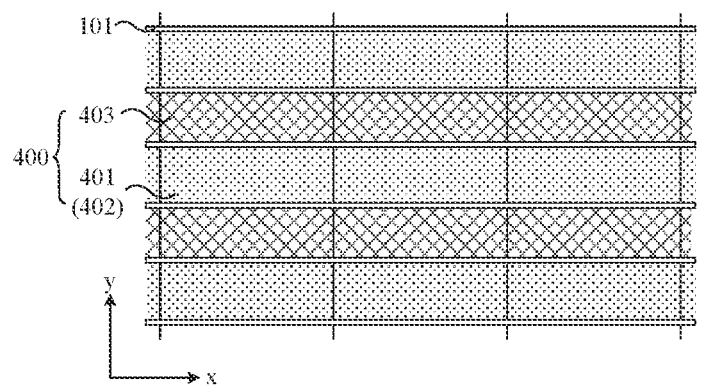
FIG. 3A to FIG. 3B are structural schematic diagrams of light-emitting materials and banks according to embodiments of the present application.
Figure 3B:
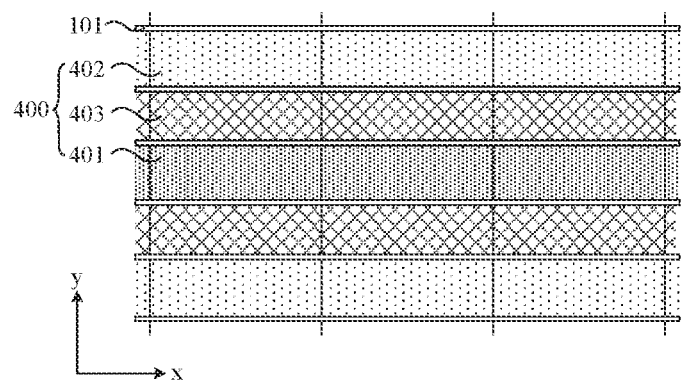

As shown in FIG. 3A to FIG. 3B, which are structural schematic diagrams of light-emitting materials and banks according to embodiments of the present application. The display panel further includes a light-emitting material 400. The light-emitting material 400 is located between two adjacent banks 101.

Further, the light-emitting material 400 includes a first light-emitting material 401, a second light-emitting material 402, and a third light-emitting material 403. The first light-emitting material 401 and the second light-emitting material 402 may be located between the same two banks 101, as shown in FIG. 3A. As a result, the first light-emitting material 401 and the second light-emitting material 402 can be made the same and integrally formed, thereby reducing a manufacturing process of the display panel and saving cost. The first light-emitting material 401 and the second light-emitting material 402 may also be located between two different banks 101, as shown in FIG. 3B. In this way, the first light-emitting material 401 and the second light-emitting material can be made of different light-emitting materials to ensure that the display panel has a higher display quality.

Specifically, please refer to FIG. 3A. The first light-emitting material 401 and the second light-emitting material 402 are located between the same two banks 101. The first sub-pixel of the first sub-pixel group includes the first light-emitting material 401. The second sub-pixel of the first sub-pixel group includes the second light-emitting material 402. Further, the third sub-pixel of the first sub-pixel group includes the first light-emitting material 401. The fourth sub-pixel of the first sub-pixel group includes the second light-emitting material 402. The first light-emitting material 401 of the first sub-pixel and the second light-emitting material 402 of the second sub-pixel between two adjacent banks are made the same and integrally formed, so as to reduce the manufacturing process.

The third light-emitting material 403 is located on a side of the first light-emitting material 401 and the second light-emitting material 403. The bank 101 is provided between the third light-emitting material 403 and the first light-emitting material 401 and the second light-emitting material 402.

Further, the first light-emitting material 401 has a first width, the second light-emitting material 402 has a second width, and the third light-emitting material 403 has a third width (that is, a width of one-color pixel). If the first sub-pixel and the second sub-pixel are arranged along the first direction x, the first width or the second width is less than or equal to the third width. If the first sub-pixel and the second sub-pixel are arranged along the second direction y, a sum of the width of the first width and the second width is greater than or equal to the third width.

Furthermore, the display panel further includes a third sub-pixel group, and the third sub-pixel group and the first sub-pixel group are located on two sides of the same bank 101. The first sub-pixel and the second sub-pixel of the first sub-pixel group are adjacent along the second direction y. The seventh sub-pixel and the eighth sub-pixel of the third sub-pixel group are adjacent to each other along the second direction y. The first sub-pixel includes the first light-emitting material 401, and the second sub-pixel includes the second light-emitting material 402. The seventh sub-pixel and the eighth sub-pixel include the third light-emitting material 403. A sum of the width of the first width and the second width is less than or equal to the third width.

Optionally, the light-emitting colors of the first light-emitting material 401, the second light-emitting material 402, and the third light-emitting material 403 include red, green, blue, yellow, or white. Further, the light-emitting colors of the first light-emitting material 401 and the second light-emitting material 402 are yellow, and the light-emitting color of the third light-emitting material 403 is blue.

Specifically, please refer to FIG. 3B. The first light-emitting material 401 and the second light-emitting material 402 are respectively located between two different banks 101, the third light-emitting material 403 is located between the first light-emitting material 401 and the second light-emitting material 402, and the bank 101 is provided among the third light-emitting material 403, the first light-emitting material 401 and the second light-emitting material 402. The display panel includes a first sub-pixel group and a second sub-pixel group arranged at intervals. Both the first sub-pixel and the second sub-pixel of the first sub-pixel group include the first light-emitting material 401. The third sub-pixel and the fourth sub-pixel of the second sub-pixel group both include the second light-emitting material 402. In this way, the first sub-pixel group and the second sub-pixel group can be made of different light-emitting materials, so that the display panel has a higher display quality. It is understood that the first light-emitting material 401 and the second light-emitting material 402 can also be made of the same material. It is not repeated here again.

Further, the first light-emitting material 401 has a first width, the second light-emitting material 402 has a second width, and the third light-emitting material 403 has a third width (that is, the width of one-color pixel). The first width and the second width are greater than or equal to the third width. That is, the first sub-pixel and the second sub-pixel of the first sub-pixel group are adjacent along the second direction y. The third sub-pixel and the fourth sub-pixel of the second sub-pixel group are adjacent along the second direction y. The first width and the second width are greater than or equal to the third width.

Furthermore, the sub-pixel group further includes a third sub-pixel group located between the first sub-pixel group and the second sub-pixel group. The bank 101 is provided among the third sub-pixel group, the first sub-pixel group and the second sub-pixel group. The seventh sub-pixel and the eighth sub-pixel of the third sub-pixel group both include the third light-emitting material 403. The light-emitting color of the first sub-pixel group is one of red or green, and the light-emitting color of the second sub-pixel group is the other of red or green. When the light-emitting color of the third sub-pixel group is blue, the first width and the second width are less than or equal to the third width.

Furthermore, the light-emitting color of the first sub-pixel group is red, the light-emitting color of the second sub-pixel group is green, and the first width is less than or equal to the second width.

Optionally, the light-emitting colors of the first light-emitting material 401, the second light-emitting material 402, and the third light-emitting material 403 include red, green, blue, yellow, or white. Further, the first light-emitting material 401 is red, the light-emitting color of the second light-emitting material 402 is green, and the light-emitting color of the third light-emitting material 403 is blue. In addition, the light-emitting color of the first light-emitting material 401 may be the same as the light-emitting color of the second light-emitting material 402. For example, the light-emitting color of the first light-emitting material 401 and the second light-emitting material 402 is yellow or the like.

Further, the display panel further includes a color filter. The color filter includes a color filter unit. Each of the color filter units is arranged corresponding to the color pixels in the pixel, so that the first color pixel, the second color pixel, and the third color pixel in each pixel cooperate with the color filter unit to realize a full-color display of the display panel.

Further, the color filter includes: a first color filter unit corresponding to the first sub-pixel 2011, and a second color filter unit corresponding to the second sub-pixel 2012; wherein colors of the first color filter unit and the second color filter unit are different.

Optionally, the first light-emitting material 401, the second light-emitting material 402, and the third light-emitting material 403, and/or the color filter unit also includes quantum dot materials, perovskite materials, fluorescent materials, etc., so as to improve a light emitting efficiency.

Figure 4A:
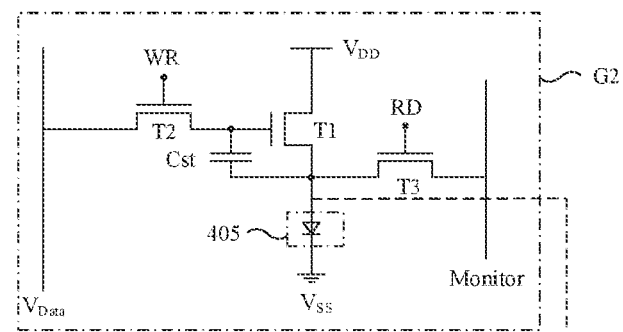
FIGS. 4A, 4B and FIG. 4C are schematic structural diagrams of pixel repair according to embodiments of the present application.
Figure 4A:
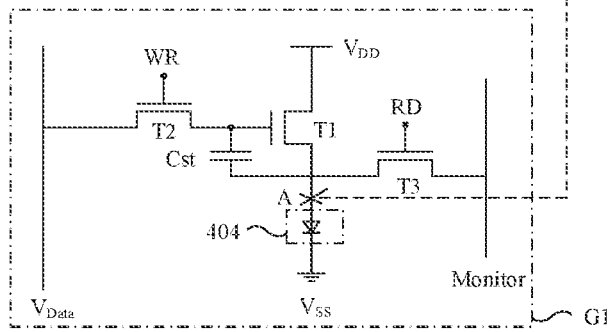
Figure 4B:
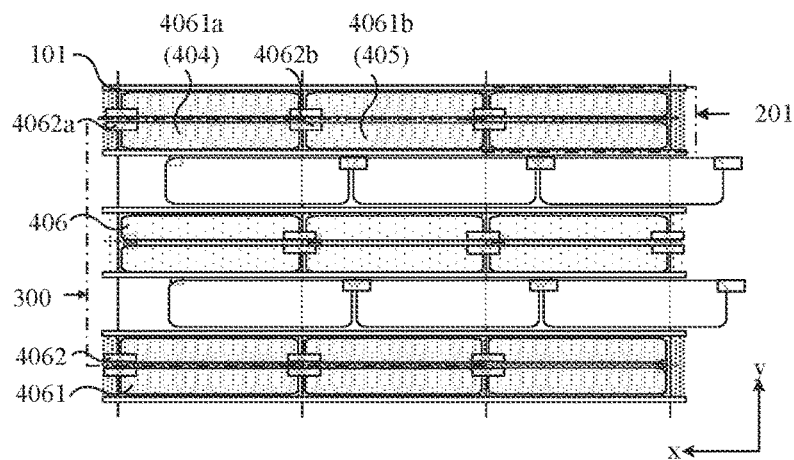
Figure 4C:
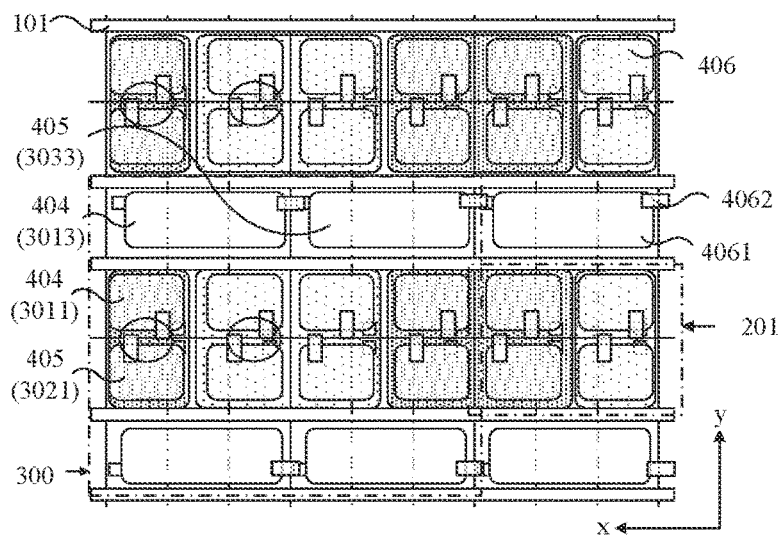

As shown in FIG. 4A to FIG. 4C, which are schematic diagrams of the pixel repair structure according to embodiments of the present application. In the manufacturing process of the display panel, due to factors such as the manufacturing process, the pixel driving circuit in the display panel and the color pixels may be disconnected or short-circuited, which affects the display quality of the display panel. Therefore, in order to reduce an influence of the disconnection or short-circuit problem on the display panel during the manufacturing process, a repair method shown in FIG. 4A to FIG. 4C is adopted to realize the electrical connection between the color pixels and the pixel driving circuit.

Specifically, the pixel driving circuit includes a 3T1C (3 transistors and 1 capacitor) structure for description. If there is a disconnection or short connection between the fourth color pixel 404 and the first pixel driving circuit G1, laser can be used to cut point A to disconnect a link between the fourth color pixel 404 and the first pixel driving circuit G1. Then, a laser welding is used to realize the electrical connection between the fourth color pixel 404 and the second pixel driving circuit G2, so that the second pixel circuit G2 can simultaneously drive the fourth color pixel 404 and the fifth color pixel 405. In this way, the electrical connection between the fourth color pixel 404 and the pixel driving circuit is realized. The fourth color pixel 404 and the fifth color pixel 405 have a same light-emitting color. Vdata is a data signal. Cst is a storage capacitor. T1, T2, and T3 are transistors. VDD and VSS are power signals. WR and RD are control signals Monitor is a detection signal.

Specifically, please refer to FIG. 2B, FIG. 3A-FIG. 3B, and FIG. 4A-FIG. 4B. The display panel includes a first electrode layer 406. The first light-emitting material 401, the second light-emitting material 402, and the third light-emitting material 403 are respectively located on the first electrode layer 406. The first electrode layer 406 includes a plurality of electrode portions 4061 and a bridge portion 4062 extending from the electrode portions 4061. The bridge portion 4062 is electrically connected to the pixel driving circuit. In a top view, a plurality of bridge portions 4062 are included between the banks 101 located on both sides of the first sub-pixel group 201, and the plurality of bridge portions are located on two sides of a center line between two adjacent banks 101 and are neighboring the center line.

Further, the fourth color pixel 404 and the fifth color pixel 402 may be the first color pixel 3011 of the first pixel 301 and the first color pixel 3031 of the third pixel 303, respectively. The electrode portion 4061 includes a first electrode portion 4061a and a second electrode portion 4061b arranged along the first direction x. The bridge portion 4062 includes a first bridge portion 4062a extending from the first electrode portion 4061a and a second bridge portion 4062b extending from the second electrode portion 4061b. The pixel driving circuit includes a first pixel driving circuit electrically connected to the first bridge portion 4062a and a second pixel driving circuit electrically connected to the second bridge portion 4062b. The first color pixel 3011 of the first pixel 301 includes the first electrode portion 4061a, and the first color pixel 3031 of the third pixel 303 includes the second electrode portion 4061b. When the electrical connection between the first bridge portion 4062a and the first pixel drive circuit fails, the first bridge portion 4062a cuts off the connection with the first pixel driving circuit through a laser process, and the second bridge portion 4062b is welded to the first electrode portion 4061a through a laser process.

Similarly, the fourth color pixel 404 and the fifth color pixel 405 may also be the third color pixel 3013 of the first pixel 301 and the third color pixel 3033 of the third pixel 303, respectively. Or, the fourth color pixel 404 and the fifth color pixel 405 may also be the first color pixel 3011 of the first pixel 301 and the first color pixel 3021 of the second pixel 302, respectively, as shown in FIG. 4C. Or, the fourth color pixel 404 and the fifth color pixel 405 are the second color pixel 3012 of the first pixel 301 and the second color pixel 3022 of the third pixel 303, etc., such that adjacent color pixels with a same color can be repaired by laser welding.

Further, please continuing to refer to FIG. 1B, the display panel further includes a substrate 111. The plurality of pixel driving circuits 112 and the pixel repeating unit 102 are all located on the substrate 111. A groove 101b is formed between two adjacent banks 101. The first light-emitting material and/or the second light-emitting material are located in the same groove 101b, and the third light-emitting material is located in the groove 101b. The bank 101 may be made of double-layer bank materials Bank1 and Bank2 to improve a wettability of the bank 101 to a planarization layer PLN and the first electrode layer 403.

The display panel further includes a light shielding layer LS, a buffer layer BL, an insulating layer IL, and a protective layer PVS on the substrate 111. The pixel driving circuit 112 includes a transistor. The transistor includes: an active layer AL; a gate insulating layer GI on the active layer AL; a gate G located on the gate insulating layer GI and arranged opposite to the active layer AL; and a source S and a drain D electrically connected to the active layer AL.

Please continue to refer to FIG. 1B and FIG. 2A. The planarization layer PLN includes a via 407, so that the first electrode layer 406 and the pixel driving circuit 112 are electrically connected through the via 407. In a top view angle, the vias 407 included in each pixel are located in different columns. The first electrode layer 406 covers the via 407, as shown in FIGS. 4B to 4C. Further, in a top view angle, the via 407 is arranged close to an edge of the first electrode layer 406 to reduce difficulty of pixel repair, as shown in FIG. 4B.

In addition, the display panel also includes: a capacitor substrate layer AL1 prepared in the same layer as the active layer AL, and a source-drain layer SD prepared in the same layer as the source electrode S and the drain electrode D. The capacitor substrate layer AL1 forms a capacitor with the light shielding layer LS and a source and drain layer SD, respectively.

As shown in FIG. 5A to FIG. 5D, which are schematic diagrams of the structure of the display motherboard provided by the embodiments of the application. An embodiment of the present application further provides a display motherboard including: a plurality of banks 501, each of the plurality of banks 501 extending in a first direction x, the plurality of banks 501 arranged in a second direction y; and a plurality of display panels comprising a first display panel 510 and a second display panel 511 with different sizes, wherein a long side of the first display panel 510 is parallel to the plurality of banks 101, and a short side of the second display panel 511 is parallel to the plurality of banks 501. Each of the first display panels 510 and each of the second display panel 511s includes a plurality of pixel repeating units 502. Each of the pixel repeating units 502 includes a plurality of pixels, and each of the pixels includes a first color pixel, a second color pixel, and a third color pixel.

Each of the first display panels 510 and each of the second display panels 511 includes a first sub-pixel group 503. The first sub-pixel group 503 is located between two adjacent banks 501. The first sub-pixel group 503 includes a first sub-pixel 5031 and a second sub-pixel 5032, wherein the first sub-pixel 5031 and the second sub-pixel 5032 are adjacent to each other. That is, there are no banks 501 between the first sub-pixel 5031 and the second sub-pixel 5032. Therefore, number of the bank 501 is reduced, thereby improving an area ratio of pixels. Thus, this display panel can take into account both requirements of an aperture ratio and a printing process, which is beneficial to mass production.

Figure 5A:
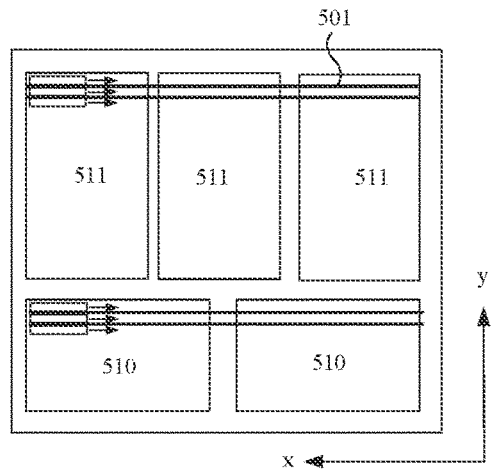
FIGS. 5A, 5B, 5C and FIG. 5D are schematic structural diagrams of a display motherboard according to an embodiment of the application.
Figure 5B:
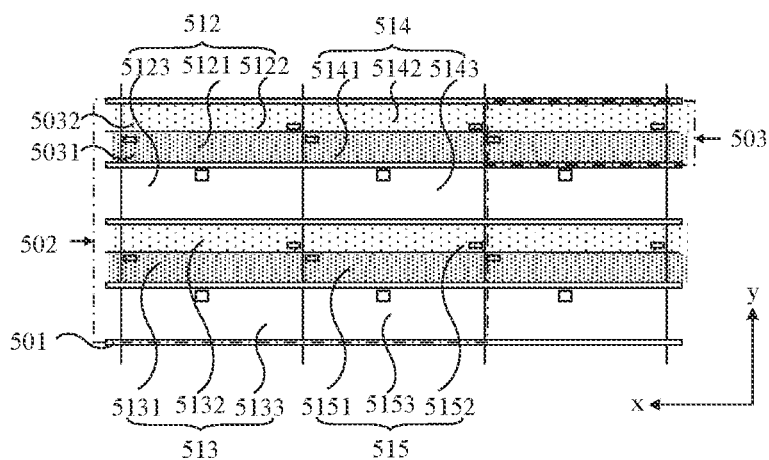
Figure 5C:
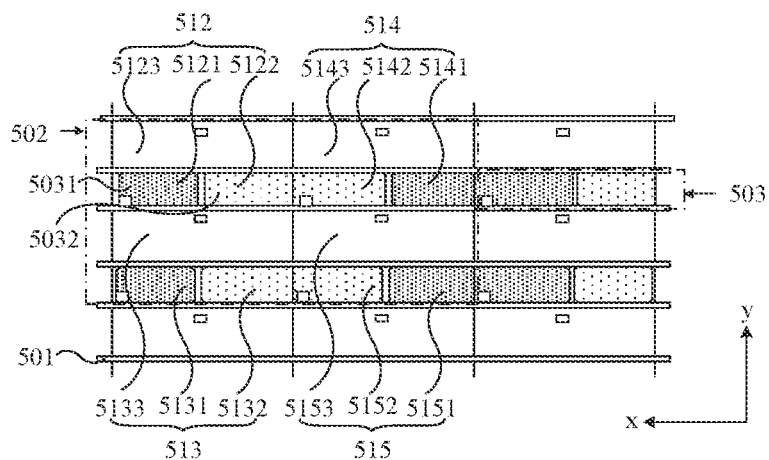

Specifically, please continue to refer to FIG. 5B to FIG. 5C. Each of the first display panels 510 includes a plurality of the pixel repeating units 502. Each pixel repeating unit 502 includes a first pixel 512. The first pixel 512 includes the first sub-pixel 5031 and the second sub-pixel 5032. That is, the first pixel 512 includes a first color pixel 5121, a second color pixel 5122, and a third color pixel 5123. The first color pixel 5121 is formed by the first sub-pixel 5031, the second color pixel 5122 is formed by the second sub-pixel 5032, and the third color pixel 5123 is located on the side of the bank 101 away from the first color pixel 5121 and the second color pixel 5122. The first sub-pixel 5031 and the second sub-pixel 5032 may be arranged along the second direction y, as shown in FIG. 5B. The first sub-pixel 5031 and the second sub-pixel 5032 may be arranged along the first direction x, as shown in FIG. 5C, such that the first pixel 512 includes two banks 101 on average. Compared with the prior art of a pixel including three banks 101 on average, the present disclosure can reduce number of banks 101, thereby improving the ratio of pixels, and enabling the display panel to take into account requirements of the manufacturing process and the aperture ratio.

Further, the third color pixel 5123 of the first pixel 512 may also be formed in a form of a sub-pixel group, so that the first pixel 512 includes only 1.5 banks 101, and number of the banks 101 is further reduced.

In addition, the first sub-pixel 5031 and the second sub-pixel 5032 may also be located in different pixels. Specifically, each pixel repeating unit 502 includes a second pixel 513 arranged on a side of the first pixel 512 along the second direction y. The first pixel 512 includes the first sub-pixel 5031, and the second pixel 513 includes the second sub-pixel 5032. That is, one of the first color pixel 5121, the second color pixel 5122, or the third color pixel 5123 of the first pixel 512 is formed by the first sub-pixel 5031. One of the first color pixel 5131, the second color pixel 5132, or the third color pixel 5133 of the second pixel 513 is formed by the second sub-pixel 5032.

Figure 5D:
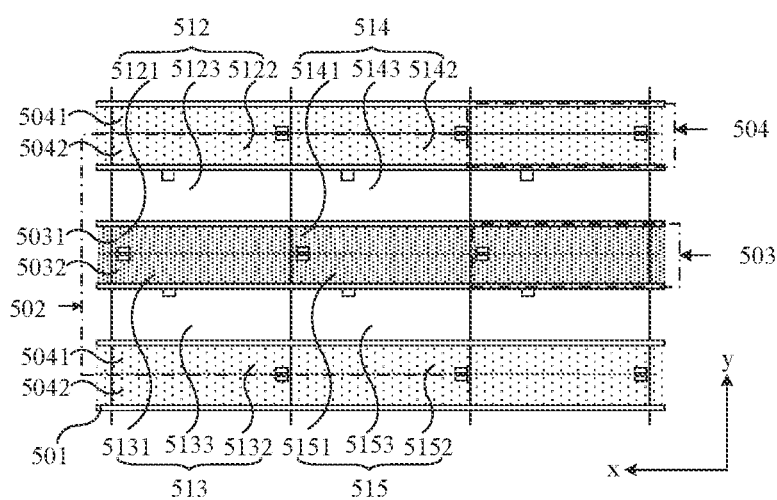

Please referring FIG. 5D, the first display panel 510 further includes a second sub-pixel group 504 spaced apart from the first sub-pixel group 503 along the second direction y. The second sub-pixel group 504 is located between two adjacent banks 501, and the second sub-pixel group 504 includes a third sub-pixel 5041 and a fourth sub-pixel 5042, wherein the third sub-pixel 5041 and the fourth sub-pixel 5042 are adjacent to each other. Further, the first sub-pixel 5031 and the second sub-pixel 5032 are adjacent to each other along the second direction y, and the third sub-pixel 5041 and the fourth sub-pixel 5042 are adjacent to each other along the second direction y. Each display panel includes a plurality of pixel repeating units 502. Each pixel repeating unit 502 includes a first pixel 512 and a second pixel 513 arranged along the second direction y. The first pixel 512 includes the fourth sub-pixel 5042 of the second sub-pixel group 504. The second pixel 513 includes the third sub-pixel 5041 of the other second sub-pixel group 504.

Specifically, the first pixel 512 and the second pixel 513 both include a first color pixel, a second color pixel, and a third color pixel. The first color pixel 5121 of the first pixel 512 is formed by the first sub-pixel 5031 of the first sub-pixel group 503. The second color pixel 5122 of the first pixel 512 is formed by the fourth sub pixel 5042 of the second sub pixel group 504. The third color pixel 5123 of the first pixel 512 is located between the first sub-pixel group 503 and the second sub-pixel group 504. The first color pixel 5131 of the second pixel 513 is formed by the second sub-pixel 5032 of the first sub-pixel group 503. The second color pixel 5132 of the second pixel 513 is formed by the third sub-pixel 5041 of the other second sub-pixel group 504. The third color pixel 5133 of the second pixel 513 is located between the first sub-pixel group 503 and the other second sub-pixel group 504, so that the first pixel 512 and the second pixel 513 both includes two banks 101. Compared with the prior art of a design in which each pixel includes three banks 101 on average, the present disclosure has a reduced number of banks 101.

In addition, the first sub-pixel group 503 further includes a fifth sub-pixel and a sixth sub-pixel. The fifth sub-pixel is arranged on a side of the first sub-pixel 5011 along the first direction x, and the sixth sub-pixel is arranged on a side of the second sub-pixel 5012 along the first direction x. The second color pixel 5122 of the first pixel 512 is formed by the fifth sub-pixel. The second color pixel 5132 of the second pixel 513 is formed by the sixth sub-pixel. The third color pixel 5123 of the first pixel 512 and the third color pixel 5133 of the second pixel 513 are respectively located on two sides of the sub-pixel group 500.

Further, the display panel further includes a third sub-pixel group, and the third sub-pixel group includes a seventh sub-pixel and an eighth sub-pixel. The seventh sub-pixel and the eighth sub-pixel are adjacent to each other. The third sub-pixel group and the first sub-pixel group 503 share a same bank 501. The arrangement of the third sub-pixel group can refer to FIG. 2E to FIG. 2F, which is not repeated here again.

Please continue to refer to FIG. 5A-FIG. 5D. The pixel repeating unit 502 further includes: a third pixel 514 arranged on a side of the first pixel 512 along the first direction x, and a fourth pixel 515 arranged on a side of the second pixel 513 along the first direction x. The third pixel 514 and the first pixel 512 are arranged symmetrically or repeatedly along an adjacent edge of the first pixel 512 and the third pixel 514. The fourth pixel 515 and the second pixel 513 are arranged symmetrically or repeatedly along an adjacent edge of the second pixel 513 and the fourth pixel 515. Specifically, the third pixel 514 and the fourth pixel 515 both include a first color pixel, a second color pixel, and a third color pixel. A design of the first color pixel 5141, the second color pixel 5142, and the third color pixel 5143 of the third pixel 514 can refer to the design of the first color pixel 5121, the second color pixel 5122, and the third color pixel 5123 of the first pixel 512. A design of the first color pixel 5151, the second color pixel 5152, and the third color pixel 5153 of the fourth pixel 515 can refer to the design of the first color pixel 5131, the second color pixel 5132, and the third color pixel 5133 of the second pixel 5131.

The display panel further includes a light-emitting material, and the light-emitting material includes a first light-emitting material, a second light-emitting material, and a third light-emitting material. The first sub-pixel 5031 includes a first light-emitting material, and the second sub-pixel 5032 includes a second light-emitting material. The first light-emitting material of the first sub-pixel 5031 and the second light-emitting material of the second sub-pixel 5032 between two adjacent banks are the same and are integrally formed. That is, the first light-emitting material and the second light-emitting material can be located between the same two banks, so that the first light-emitting material and the second light-emitting material can be made of the same and integrally made. Therefore, the manufacturing process of the display panel is reduced, and the cost is saved.

In addition, the first light-emitting material and the second light-emitting material may also be located between two different banks 501, so that the first light-emitting material and the second light-emitting material can be made of different light-emitting materials to ensure that the display panel has a higher display quality.

Optionally, light-emitting colors of the first light-emitting material, the second light-emitting material, and the third light-emitting material include red, green, blue, yellow, or white. Further, light-emitting colors of the first light-emitting material and the second light-emitting material include red, yellow, green, or white. Furthermore, the light-emitting color of the first light-emitting material and the second light-emitting material is yellow, and the light-emitting color of the third light-emitting material is blue. Or, the light-emitting color of the first light-emitting material is red, the light-emitting color of the second light-emitting material is green, and the light-emitting color of the third light-emitting material is blue.

Further, the display panel further includes a color filter. The color filter includes a color filter unit, and each of the color filter units corresponds to a color pixel arrangement in a pixel. The first color pixel, the second color pixel and the third color pixel in each pixel cooperate with the color filter unit to realize a full-color display of the display panel.

Optionally, the first light-emitting material, the second light-emitting material, and the third light-emitting material, and/or the color filter unit includes quantum dot materials, perovskite materials, fluorescent materials, etc., so as to improve light-emitting efficiency.

The present application also provides a display device including any of the above-mentioned display panels.

In the above-mentioned embodiments, the description of each embodiment has its own emphasis. For parts that are not described in detail in an embodiment, reference may be made to related descriptions of other embodiments. The description of the above embodiment is only used to help understand the technical solution of the application and its core idea. Those of ordinary skill in the art should understand that they can still modify the technical solutions described in the foregoing embodiments, or equivalently replace some of the technical features. These modifications or replacements do not cause the essence of the corresponding technical solutions to deviate from the scope of the technical solutions of the embodiments of the present application.

What is claimed is:

1. A display panel, comprising:
   a plurality of banks, each of the plurality of banks extending in a first direction, the plurality of banks arranged in a second direction;
   a first sub-pixel group located between two adjacent banks, wherein the first sub-pixel group comprises a first sub-pixel and a second sub-pixel adjacent to each other; and
   a second sub-pixel group spaced apart from the first sub-pixel group along the second direction, wherein the second sub-pixel group is located between two adjacent banks, and two adjacent banks are arranged between the first sub-pixel group and the second sub-pixel group adjacent to the first sub-pixel group,
   wherein the first sub-pixel is adjacent to the second sub-pixel along the second direction, wherein the display panel comprises a plurality of pixel repeating units, each of the plurality of pixel repeating units comprises a first pixel and a second pixel, and the first pixel and the second pixel are arranged along the second direction, wherein the first pixel comprises the first sub-pixel, and the second pixel comprises the second sub-pixel,
   the second sub-pixel group comprises a third sub-pixel and a fourth sub-pixel adjacent to each other along the second direction, wherein the first pixel comprises the fourth sub-pixel of the second sub-pixel group, and the second pixel comprises the third sub-pixel of another second sub-pixel group,
   wherein each of the plurality of pixel repeating units further comprises a third pixel and a fourth pixel, the third pixel is adjacent to the fourth pixel along the second direction, the third pixel is arranged on a side of the first pixel along the first direction, the third pixel and the first pixel are symmetrically arranged along adjacent edges of the first pixel and the third pixel, the fourth pixel is arranged on a side of the second pixel along the first direction, and the fourth pixel and the second pixel are symmetrically arranged along adjacent edges of the second pixel and the fourth pixel,
   the bank is not arranged between the first pixel and the third pixel, and the bank is not arranged between the second pixel and the fourth pixel, and
   wherein each of the plurality of pixel repeating units comprises a first color pixel, a second color pixel, and a third color pixel, wherein light-emitting colors of the first color pixel, the second color pixel, and the third color pixel are different.

2. The display panel according to claim 1, wherein the first sub-pixel comprises a first light-emitting material, the second sub-pixel comprises a second light-emitting material, wherein the first light-emitting material of the first sub-pixel and the second light-emitting material of the second sub-pixel are the same and are integrally formed.

3. The display panel according to claim 1, wherein the first sub-pixel group further comprises a fifth sub-pixel and a sixth sub-pixel, the fifth sub-pixel and the sixth sub-pixel are arranged along the second direction, the fifth sub-pixel is arranged on a side of the first sub-pixel along the first direction, and the sixth sub-pixel is arranged on a side of the second sub-pixel along the first direction, wherein the first pixel comprises the fifth sub-pixel, and the second pixel comprises the sixth sub-pixel.

4. The display panel according to claim 1, further comprising a third sub-pixel group, wherein the third sub-pixel group and the first sub-pixel group share a same bank, the third sub-pixel group comprises a seventh sub-pixel and an eighth sub-pixel, and the seventh sub-pixel and the eighth sub-pixel are adjacent to each other, wherein the first pixel comprises the seventh sub-pixel of the third sub-pixel group, and the second pixel comprises the eighth sub-pixel of the third sub-pixel group.

5. The display panel according to claim 1, further comprising a plurality of pixel repeating units, wherein each of the pixel repeating units comprises a first pixel, and the first pixel comprises the first sub-pixel and the second sub-pixel.

6. The display panel according to claim 5, wherein each of the pixel repeating units further comprises a second pixel, a third pixel, and a fourth pixel, the second pixel is arranged on a side of the first pixel along the second direction, the third pixel is arranged on a side of the first pixel along the first direction, the fourth pixel is arranged on a side of the third pixel along the second direction, the fourth pixel is arranged on a side of the second pixel along the first direction, the second pixel and the first pixel are symmetrically arranged along adjacent edges of the second pixel and the first pixel, the third pixel and the first pixel are symmetrically arranged along adjacent edges of the first pixel and the third pixel, and the fourth pixel and the second pixel are symmetrically arranged along adjacent edges of the second pixel and the fourth pixel.

7. The display panel according to claim 2, further comprising a pixel driving circuit and a first electrode layer, wherein the first light-emitting material and the second light-emitting material are respectively located on the first electrode layer, the first electrode layer comprises a plurality of electrode portions and a plurality of bridge portions extending from the plurality of electrode portions, and the plurality of bridge portions are electrically connected to the pixel driving circuit, wherein, in a top view, the plurality of bridge portions are located on two sides of a center line between two adjacent banks and are neighboring the center line.

8. The display panel according to claim 7, wherein each of the plurality of electrode portions comprises a first electrode portion and a second electrode portion, the first electrode portion and the second electrode portion are arranged in a first direction, wherein each of the plurality of bridge portion comprises a first bridge portion extending from the first electrode portion and a second bridge portion extending from the second electrode portion, wherein the pixel driving circuit comprises a first pixel driving circuit electrically connected to the first bridge portion and a second pixel driving circuit electrically connected to the second bridge portion, wherein when an electrical connection between the first bridge portion and the first pixel driving circuit fails, the first bridge portion cuts off a connection with the first pixel driving circuit through a laser process, and the second bridge portion is welded to the first electrode portion through the laser process.

9. The display panel according to claim 2, wherein a light-emitting color of the first light-emitting material and the second light-emitting material is red, yellow, green, or white.

10. The display panel according to claim 2, further comprising a color filter, wherein the color filter comprises a first color filter unit corresponding to the first sub-pixel, and a second color filter unit corresponding to the second sub-pixel, wherein colors of the first color filter unit and the second color filter unit are different.

* * * * *